United States Patent
Frye et al.

(10) Patent No.: US 8,921,127 B2
(45) Date of Patent: Dec. 30, 2014

(54) SEMICONDUCTOR DEVICE AND METHOD OF SIMULTANEOUS TESTING OF MULTIPLE INTERCONNECTS FOR ELECTRO-MIGRATION

(75) Inventors: Robert C. Frye, Piscataway, NJ (US); Kai Liu, Phoenix, AZ (US)

(73) Assignee: STATS ChipPAC, Ltd., Singapore (SG)

( * ) Notice: Subject to any disclaimer, the term of this patent is extended or adjusted under 35 U.S.C. 154(b) by 128 days.

(21) Appl. No.: 13/426,576

(22) Filed: Mar. 21, 2012

(65) Prior Publication Data

US 2013/0248859 A1 Sep. 26, 2013

(51) Int. Cl.
*H01L 21/66* (2006.01)
*G01R 31/26* (2014.01)

(52) U.S. Cl.
USPC ............. 438/14; 438/15; 438/17; 257/48; 257/738; 257/778; 257/E21.521

(58) Field of Classification Search
USPC ............ 438/14, 15, 17; 257/48, 738, 778, 257/E21.521
See application file for complete search history.

(56) References Cited

U.S. PATENT DOCUMENTS

| | | | |
|---|---|---|---|
| 5,541,524 A * | 7/1996 | Tuckerman et al. | 324/750.07 |
| 7,394,280 B1 | 7/2008 | Low et al. | |
| 7,825,769 B2 * | 11/2010 | Nomura et al. | 338/309 |
| 2002/0034833 A1 * | 3/2002 | Akram | 438/17 |
| 2010/0134125 A1 * | 6/2010 | Aubel et al. | 324/719 |
| 2010/0327892 A1 | 12/2010 | Agarwal et al. | |

OTHER PUBLICATIONS

Bauer, Electromigration Behavior of Interconnects between Chip and Board for Embedded Wafer Level Ball Grid Array (eWLB), Electronic Components and Technology Conference, 2011, pp. 317-325, Germany.

JEDEC, Guideline for Characterizing Solder Bump Electromigration Under Constant Current and Temperature Stress, 2008, JEP154, JEDEC Solid State Techonolgy Association, Arlington, VA.

* cited by examiner

*Primary Examiner* — Michelle Mandala
(74) *Attorney, Agent, or Firm* — Robert D. Atkins; Patent Law Group: Atkins and Associates, P.C.

(57) ABSTRACT

A semiconductor device has a substrate and conductive layer over the substrate. A resistive element is formed between first and second portions of the conductive layer. A plurality of semiconductor die each with first and second bumps is mounted to the substrate with the first and second bumps electrically connected to the first and second portions of the conductive layer. A test current is routed in sequence through the first portion of the conductive layer, through the first and second bumps, and through the second portion of the conductive layer until continuity failure of the second bump. The test current originates from a single power supply. The test current continues to flow through the resistive element after the continuity failure of the second bump. The continuity failure can be detected by sensing an increase in voltage across the second bump.

23 Claims, 6 Drawing Sheets

SEMICONDUCTOR DEVICE AND METHOD OF SIMULTANEOUS TESTING OF MULTIPLE INTERCONNECTS FOR ELECTRO-MIGRATION

FIELD OF THE INVENTION

The present invention relates in general to semiconductor devices and, more particularly, to a semiconductor device and method of simultaneous testing of multiple interconnects for electro-migration.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Figure 1:
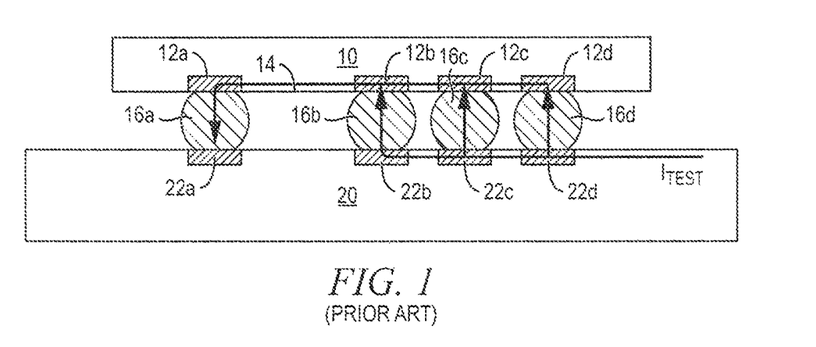
FIG. 1 illustrates a conventional electro-migration testing of an interconnect structure.

FIG. 1 shows a conventional semiconductor die 10 with contact pads 12 formed on active surface 14. A plurality of bumps 16 is formed over contact pads 12. Substrate 10 is mounted to substrate or test bed 20 with bumps 16 electrically connected to conductive layer 22.

A common test for semiconductor die 10 is electro-migration testing, which involves routing a large DC test current $I_{TEST}$ through the interconnect under test. The electron momentum associated with the large DC current causes metal atoms from the bump and conductive layers under test to move with the current flow. When a sufficient number of metal atoms have been displaced from the bump under test or conductive layers under test due to electro-migration, the low-impedance interconnect integrity breaks down to an open circuit condition. Electro-migration is a principal cause of interconnect defects and failures in semiconductor devices. Measurement of electro-migration characteristics is important in establishing design guidelines to ensure adequate long-term reliability.

To test electro-migration, the DC test current $I_{TEST}$ is divided between conductive layer $22b$-$22d$, bumps $16b$-$16d$, and conductive layer $12b$-$12d$. The full DC test current flows through conductive layer $12a$, bump $16a$, and conductive layer $22a$ as the interconnect under test. The electro-migration testing is a long process, typically over a number of months, to determine how long bump $16a$ and conductive layers $12a$ and $22a$ can withstand a given DC test current before failure, i.e., before the bump or conductive layer breaks down to an open circuit condition.

The configuration of substrate 20 accommodates a single interconnect under test, i.e., bump $16a$ and conductive layers $12a$ and $22a$. Given that a large number (hundreds) of interconnects must be tested concurrently, substrate 20 requires many power supplies to generate the individual DC test currents. The large number of power supplies and complex wiring needed to perform the electro-migration testing involves significant cost.

Figure 2:
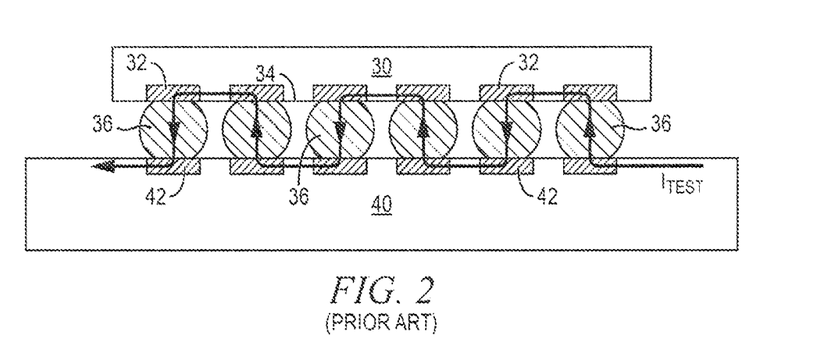
FIG. 2 illustrates a conventional electro-migration testing of multiple interconnect structures in a daisy-chain arrangement.

FIG. 2 shows another known electro-migration testing arrangement with semiconductor die 30 having contact pads 32 formed on active surface 34. A plurality of bumps 36 is formed over contact pads 32. Substrate 30 is mounted to substrate or test bed 40 with bumps 36 electrically connected to conductive layer 42. The DC test current $I_{TEST}$ is routed through bumps 36 and contact pads 32, and conductive layer 42 in a daisy-chain arrangement to test all bumps 36 simultaneously. However, the electro-migration testing ends with the first bump to fail as the DC test current path is broken. The DC test current no longer flows through the remaining bumps 36. The daisy-chain arrangement measures only the weakest bump in the chain and therefore samples only a portion of the statistical distribution.

SUMMARY OF THE INVENTION

A need exists to perform electro-migration testing over a complete statistical range without the cost associated with multiple power supplies. Accordingly, in one embodiment, the present invention is a method of making a semiconductor device comprising the steps of providing a substrate, forming a conductive layer over the substrate, forming a resistive element between first and second portions of the conductive layer, providing a semiconductor die with first and second bumps, mounting the semiconductor die to the substrate with the first and second bumps electrically connected to the first and second portions of the conductive layer, respectively, and routing a test current in sequence through the first portion of the conductive layer, through the first and second bumps, and through the second portion of the conductive layer until continuity failure of the second bump. The test current continues to flow through the resistive element after the continuity failure of the second bump.

In another embodiment, the present invention is a method of making a semiconductor device comprising the steps of providing a substrate, forming a conductive layer over the substrate, forming a resistive element between first and second portions of the conductive layer, providing a semiconductor die with a plurality of interconnect structures, mounting the semiconductor die to the substrate with the interconnect structures electrically connected to the first and second portions of the conductive layer, and routing a test current in sequence through the interconnect structures until continuity failure of one of the interconnect structures. The test current continues to flow through the resistive element after the continuity failure.

In another embodiment, the present invention is a method of making a semiconductor device comprising the steps of providing an electro-migration test substrate, forming a conductive layer over the electro-migration test substrate, and forming a resistive element between portions of the conductive layer on the electro-migration test substrate.

In another embodiment, the present invention is a semiconductor device comprising an electro-migration test substrate. A conductive layer is formed over the electro-migration test substrate. A resistive element is formed between portions of the conductive layer on the electro-migration test substrate.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
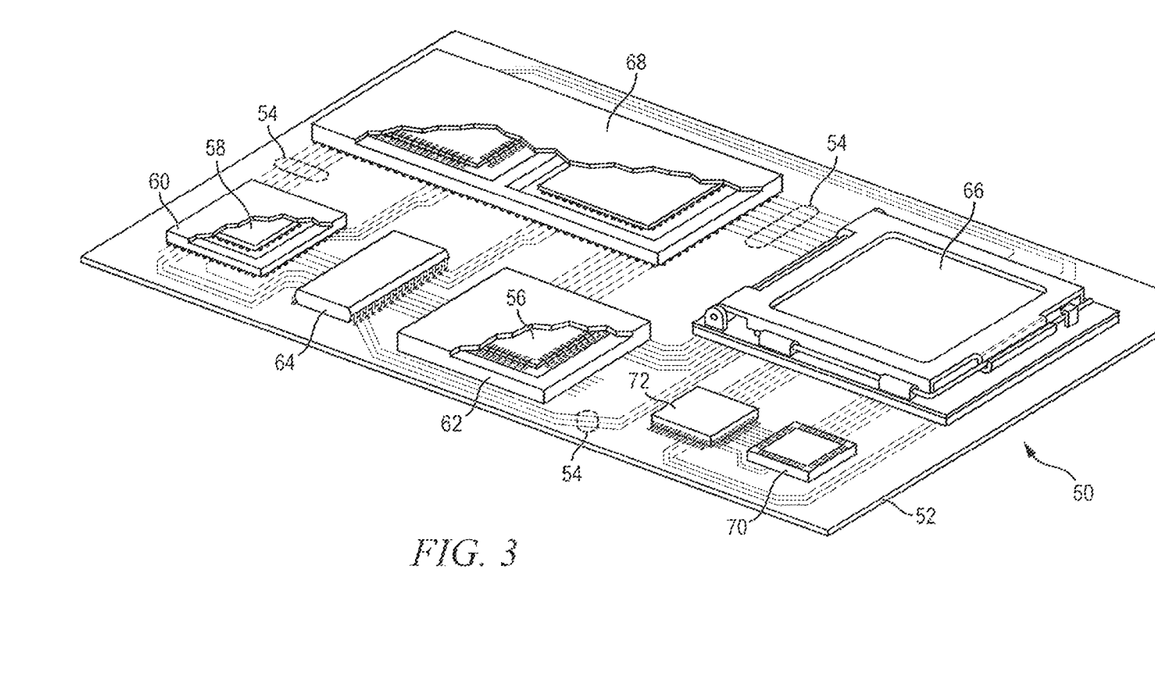
FIG. 3 illustrates a printed circuit board (PCB) with different types of packages mounted to its surface.

FIG. 3 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 4A:
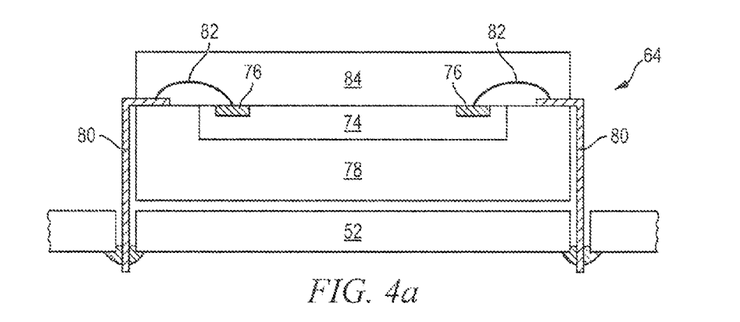
FIGS. 4a-4c illustrate further detail of the representative semiconductor packages mounted to the PCB.

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

Figure 4B:
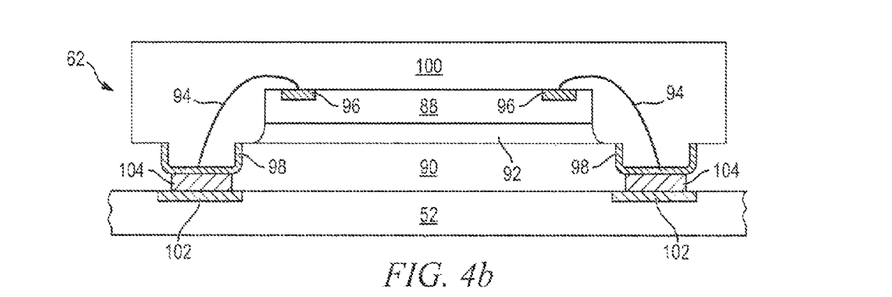

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 4C:
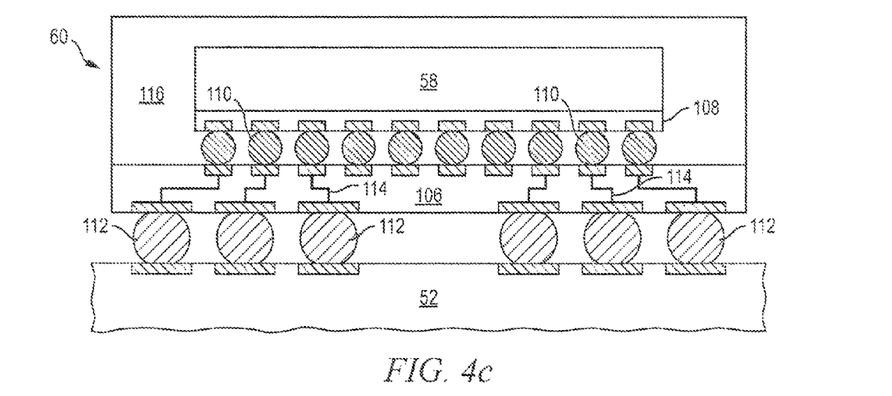

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5A:
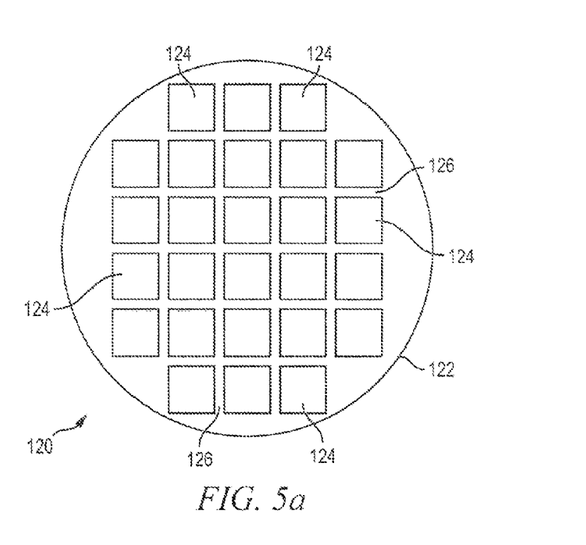
FIGS. 5a-5c illustrate a semiconductor wafer with a plurality of semiconductor die separated by a saw street.

FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 5B:
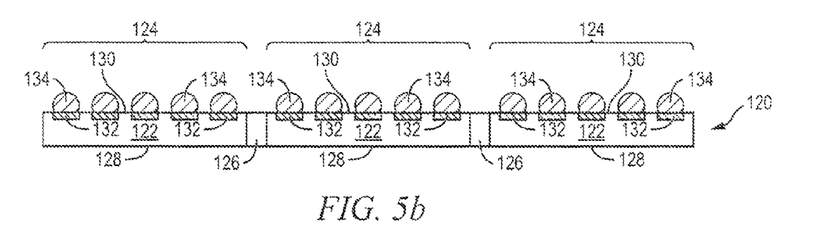

FIG. 5b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded to contact pads 132. Bumps 134 represent one type of interconnect structure that can be formed over contact pads 132. The interconnect structure can also use stud bump, micro bump, or other electrical interconnect.

Figure 5C:
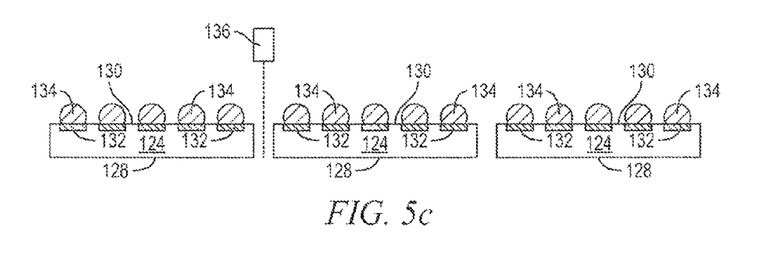

In FIG. 5c, semiconductor wafer 120 is singulated through saw street 126 using a saw blade or laser cutting tool 136 into individual semiconductor die 124.

Figure 6A:
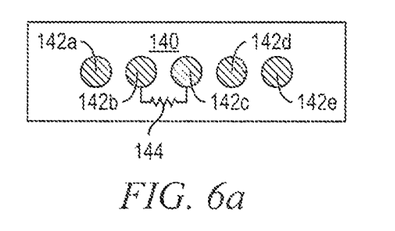
FIGS. 6a-6c illustrate mounting a semiconductor die to a test substrate for electro-migration testing.

FIG. 6a shows a plan view of test substrate 140 including conductive layers 142a-142e. In one embodiment, substrate 140 is a test bed designated for performing various testing on semiconductor die 124, including electro-migration testing. The electro-migration testing involves routing a large DC current through bumps 134 and conductive layers 132 and 142. The electron momentum associated with the large DC current causes metal atoms from bumps 134 and conductive layers 132 and 142 to move with the current flow. When a sufficient number of metal atoms have been displaced from bumps 134 and conductive layers 132 and 142 due to electro-migration, the low-impedance interconnect integrity breaks down to an open circuit condition. Bumps 134 or conductive layers 132 and 142 fail to maintain electrical continuity. Electro-migration is a principal cause of interconnect defects and failures in semiconductor devices. Measurement of electro-migration characteristics is important in establishing design guidelines to ensure adequate long-term reliability.

The electro-migration testing can be a long process to determine how long bumps 134 and conductive layers 132 and 142 can withstand a DC test current before failure, i.e., before the bump or conductive layer breaks down to an open circuit condition. To simplify the electro-migration test arrangement, a resistive element 144 is disposed on substrate 140 and electrically connected between conductive layer 142b and conductive layer 142c. In an embodiment testing multiple interconnects, resistive element 144 conducts the DC test current and continues the electro-migration testing after failure of any one or more interconnects.

Figure 6B:
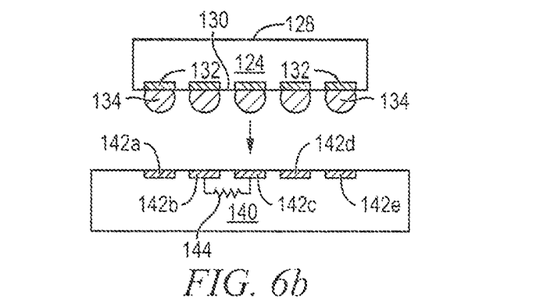
Figure 6C:
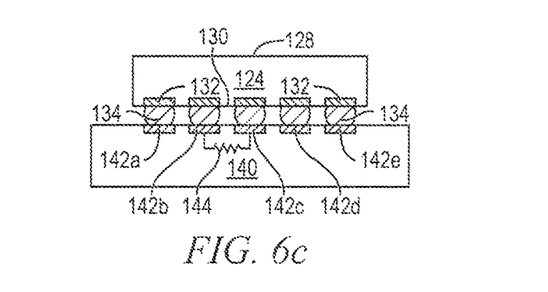

In FIG. 6b, semiconductor die 124 is positioned over substrate 140 with bumps 134 aligned with conductive layer 142. FIG. 6c shows semiconductor die 124 mounted to substrate 140 with bumps 134 metallurgically and electrically connected to conductive layer 142. Bumps 134 are typically reflowed twice to simulate the worst-case thermal cycle that a semiconductor die would receive in the manufacture of a two-sided PCB. The thermal cycling leads to growth of intermetallic compounds. Using two reflow cycles in the test helps to insure that assembly conditions of the tested semiconductor die closely resemble that of a production die.

Figure 7:
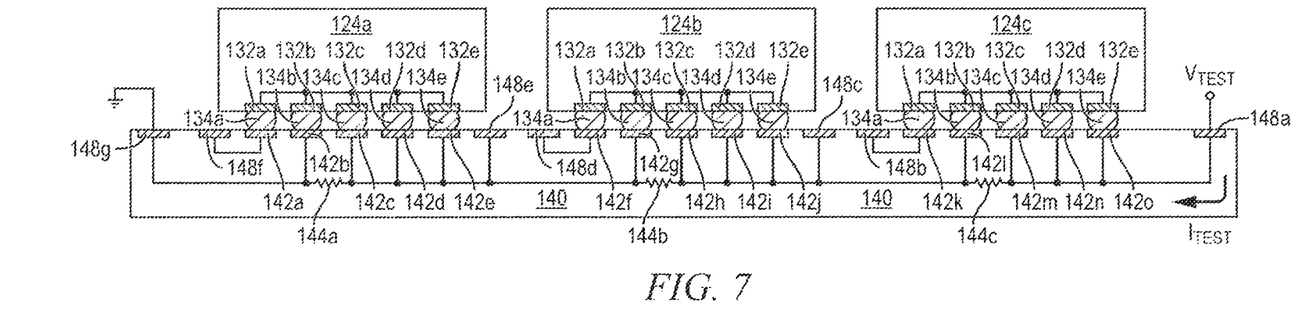
FIG. 7 illustrates electro-migration testing of multiple interconnects with a single power supply.

To simplify and reduce the execution time of the electro-migration testing, a plurality of semiconductor die 124a-124c is mounted to substrate 140 with bumps 134 metallurgically and electrically connected to conductive layer 142, as shown in FIG. 7. The number of semiconductor die 124 mounted to substrate 140 for electro-migration testing typically ranges from 15-30 units with 300-600 bumps in the test population to obtain an adequate statistic sample.

A DC test voltage $V_{TEST}$ is applied to test point 148a to cause a DC test current $I_{TEST}$ to flow through conductive layer 142a-142o. At least three different values of the DC test current $I_{TEST}$ in the range of 3-5 amperes are used in the electro-migration testing with current densities on the order of $10^4$ amperes/cm$^2$ to accelerate the time to a failure state. The electro-migration testing is conducted under at least three different temperatures, less than 150° C. to reduce intermetallic compound (IMC) growth.

Conductive layer 132a-132e of each semiconductor die 124a-124c are electrically common. Conductive layer 142m-142o are electrically common. The DC test current $I_{TEST}$ flows through conductive layer 142m-142o, bumps 134c-134e of semiconductor die 124c, and conductive layer 132c-132e of semiconductor die 124c. The DC test current $I_{TEST}$ also flows through conductive layer 132b of semiconductor die 124c, bump 134b of semiconductor die 124c, and conductive layer 142l. Since conductive layer 142m-142o and conductive layer 132c-132e of semiconductor die 124c are electrically common, the DC test current $I_{TEST}$ is evenly divided between conductive layer 142m-142o, bumps 134c-134e of semiconductor die 124c, and conductive layer 132c-132e of semiconductor die 124c. Conductive layer 132b of semiconductor die 124c, bump 134b of semiconductor die 124c, and conductive layer 142l is an interconnect under test and receive the full DC test current $I_{TEST}$. The value of resistive element 144c is selected large so that conductive layer 132b of semiconductor die 124c, bump 134b of semiconductor die 124c, and conductive layer 142l conduct sufficient DC test current $I_{TEST}$ to complete electro-migration to failure. In one embodiment, the resistance of conductive layer 132b, bump 134b, and conductive layer 142l is about 1-10 milliohms and the resistance of resistive element 144c has a value of 100 milliohms.

Conductive layer 142h-142j are electrically common. The DC test current $I_{TEST}$ continues through conductive layer 142h-142j, bumps 134c-134e of semiconductor die 124b, and conductive layer 132c-132e of semiconductor die 124b. The DC test current $I_{TEST}$ also flows through conductive layer 132b of semiconductor die 124b, bump 134b of semiconductor die 124b, and conductive layer 142g. Since conductive layer 142h-142j and conductive layer 132c-132e of semiconductor die 124b are electrically common, the DC test current $I_{TEST}$ is evenly divided between conductive layer 142h-142j, bumps 134c-134e of semiconductor die 124b, and conductive layer 132c-132e of semiconductor die 124b. Conductive layer 132b of semiconductor die 124b, bump 134b of semiconductor die 124b, and conductive layer 142g is an interconnect under test and receive the full DC test current $I_{TEST}$. The value of resistive element 144b is selected large so that conductive layer 132b of semiconductor die 124b, bump 134b of semiconductor die 124b, and conductive layer 142g conduct sufficient DC test current $I_{TEST}$ to complete electro-migration to failure. In one embodiment, the resistance of conductive layer 132b, bump 134b, and conductive layer 142g is about 1-10 milliohms and the resistance of resistive element 144b has a value of 100 milliohms.

Conductive layer 142c-142e are electrically common. The DC test current $I_{TEST}$ continues through conductive layer 142c-142e, bumps 134c-134e of semiconductor die 124a, and conductive layer 132c-132e of semiconductor die 124a. The DC test current $I_{TEST}$ also flows through conductive layer 132b of semiconductor die 124a, bump 134b of semiconductor die 124a, and conductive layer 142b. Since conductive layer 142c-142e and conductive layer 132c-132e of semiconductor die 124a are electrically common, the DC test current $I_{TEST}$ is evenly divided between conductive layer 142c-142e, bumps 134c-134e of semiconductor die 124a, and conductive layer 132c-132e of semiconductor die 124a. Conductive layer 132b of semiconductor die 124a, bump 134b of semiconductor die 124a, and conductive layer 142b is an interconnect under test and receive the full DC test current $I_{TEST}$. The value of resistive element 144a is selected large so that conductive layer 132b of semiconductor die 124a, bump 134b of semiconductor die 124a, and conductive layer 142b conduct sufficient DC test current $I_{TEST}$ to complete electro-migration to failure. In one embodiment, the resistance of conductive layer 132b, bump 134b, and conductive layer 142b is about 1-10 milliohms and the resistance of resistive element 144a has a value of 100 milliohms.

Figure 8:
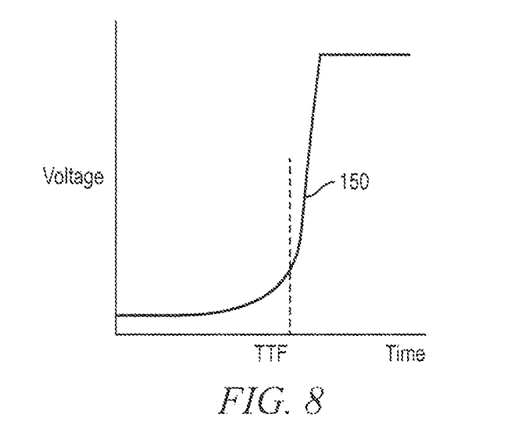
FIG. 8 illustrates a time-to-failure graph during electro-migration testing.

FIG. 8 illustrates of time-to-failure (TTF) graph as voltage versus time. At the time of failure point 150, the resistance of conductive layer 132b, bump 134b, or conductive layer 142 increases rapidly. Power consumption increases with higher resistance leading to thermal runaway condition and open-circuit failure of the interconnect.

Assume conductive layer 132b of semiconductor die 124c, bump 134b of semiconductor die 124c, or conductive layer 142*l* fails due to electro-migration. Conductive layer 132*b* of semiconductor die 124*c*, bump 134*b* of semiconductor die 124*c*, or conductive layer 142*l* will fail before conductive layer 142*m*-142*o*, bumps 134*c*-134*e* of semiconductor die 124*c*, or conductive layer 132*c*-132*e* of semiconductor die 124*c* because the DC test current $I_{TEST}$ is evenly divided between conductive layer 142*m*-142*o*, bumps 134*c*-134*e* of semiconductor die 124*c*, and conductive layer 132*c*-132*e* of semiconductor die 124*c*, while conductive layer 132*b* of semiconductor die 124*c*, bump 134*b* of semiconductor die 124*c*, and conductive layer 142*l* receive the full DC test current $I_{TEST}$. Upon failure of conductive layer 132*b* of semiconductor die 124*c*, bump 134*b* of semiconductor die 124*c*, or conductive layer 142*l* due to electro-migration, the full DC test current $I_{TEST}$ is automatically routed through resistive element 144*c* to continue the electro-migration testing of conductive layer 132*b* of semiconductor die 124*b*, bump 134*b* of semiconductor die 124*b*, and conductive layer 142*g*, as well as conductive layer 132*b* of semiconductor die 124*a*, bump 134*b* of semiconductor die 124*a*, and conductive layer 142*b*.

The failure of conductive layer 132*b* of semiconductor die 124*c*, bump 134*b* of semiconductor die 124*c*, or conductive layer 142*l* can be detected by sensing the voltage across conductive layer 132*b* of semiconductor die 124*c*, bump 134*b* of semiconductor die 124*c*, or conductive layer 142*l* at test points 148*b*-148*c*. An increase in voltage at test points 148*b*-148*c* indicates an open circuit failure of conductive layer 132*b* of semiconductor die 124*c*, bump 134*b* of semiconductor die 124*c*, or conductive layer 142*l*. The electro-migration testing continues for conductive layer 132*b* of semiconductor die 124*b*, bump 134*b* of semiconductor die 124*b*, and conductive layer 142*g*, as well as conductive layer 132*b* of semiconductor die 124*a*, bump 134*b* of semiconductor die 124*a*, and conductive layer 142*b*, by nature of resistive element 144*c* conducting the DC test current $I_{TEST}$ to the remaining interconnects under test. Resistive element 144*c* maintains electrical continuity between conductive layer 142*m* and 142*j* after an open circuit failure of conductive layer 132*b* of semiconductor die 124*c*, bump 134*b* of semiconductor die 124*c*, or conductive layer 142*l*.

Next, assume conductive layer 132*b* of semiconductor die 124*b*, bump 134*b* of semiconductor die 124*b*, or conductive layer 142*g* fails due to electro-migration. Conductive layer 132*b* of semiconductor die 124*b*, bump 134*b* of semiconductor die 124*b*, or conductive layer 142*g* will fail before conductive layer 142*h*-142*j*, bumps 134*c*-134*e* of semiconductor die 124*b*, or conductive layer 132*c*-132*e* of semiconductor die 124*b* because the DC test current $I_{TEST}$ is evenly divided between conductive layer 142*h*-142*j*, bumps 134*c*-134*e* of semiconductor die 124*b*, and conductive layer 132*c*-132*e* of semiconductor die 124*b*, while conductive layer 132*b* of semiconductor die 124*b*, bump 134*b* of semiconductor die 124*b*, and conductive layer 142*g* receive the full DC test current $I_{TEST}$. Upon failure of conductive layer 132*b* of semiconductor die 124*b*, bump 134*b* of semiconductor die 124*b*, or conductive layer 142*g* due to electro-migration, the full DC test current $I_{TEST}$ is automatically routed through resistive element 144*b* to continue the electro-migration testing of conductive layer 132*b* of semiconductor die 124*a*, bump 134*b* of semiconductor die 124*a*, and conductive layer 142*b*.

The failure of conductive layer 132*b* of semiconductor die 124*b*, bump 134*b* of semiconductor die 124*b*, or conductive layer 142*g* can be detected by sensing the voltage across conductive layer 132*b* of semiconductor die 124*b*, bump 134*b* of semiconductor die 124*b*, or conductive layer 142*g* at test points 148*d*-148*e*. An increase in voltage at test points 148*d*-148*e* indicates an open circuit failure of conductive layer 132*b* of semiconductor die 124*b*, bump 134*b* of semiconductor die 124*b*, or conductive layer 142*g*. The electro-migration testing continues for conductive layer 132*b* of semiconductor die 124*a*, bump 134*b* of semiconductor die 124*a*, and conductive layer 142*b*, by nature of resistive element 144*b* conducting the DC test current $I_{TEST}$ to the remaining interconnects under test. Resistive element 144*b* maintains electrical continuity between conductive layer 142*h* and 142*e* after an open circuit failure of conductive layer 132*b* of semiconductor die 124*b*, bump 134*b* of semiconductor die 124*b*, or conductive layer 142*g*.

Substrate 140 with resistive elements 144*a*-144*c* accommodates multiple semiconductor die 124*a*-124*c* and allows multiple interconnects to be tested simultaneously using a single power supply to generate the DC test current $I_{TEST}$. The net resistance of semiconductor die 124*a*-124*c* is monitored, rather than the resistance of each interconnect, to simplify the electro-migration test. A cumulative time-to-failure (CTTF) can be determined by the sum of the individual TTF. When approximately half of the interconnects under test have failed due to electro-migration, a median time-to-failure (MTTF) can be determined.

Figure 9:
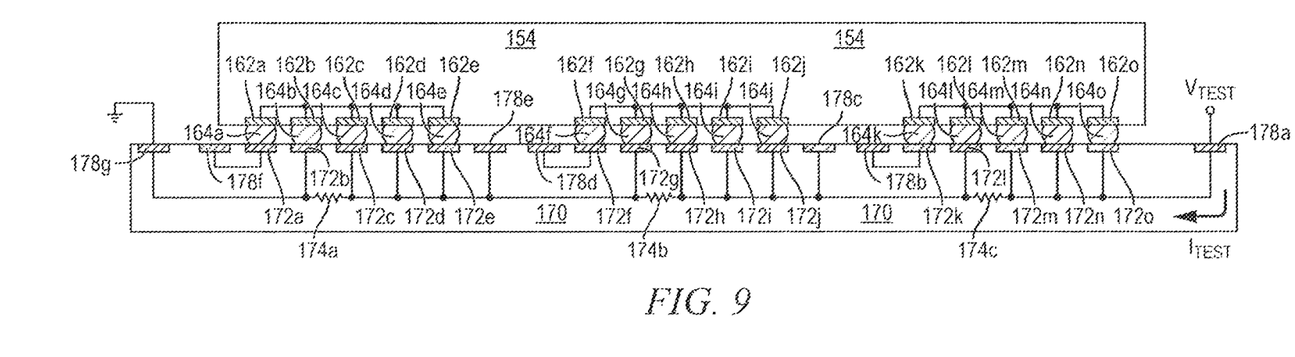
FIG. 9 illustrates electro-migration testing of multiple interconnects in a large semiconductor die with a single power supply.

FIG. 9 shows an embodiment with a single semiconductor die 154 formed similar to FIGS. 4*a*-4*c* with a large I/O count. Conductive layer 162 is formed over active surface 160 of semiconductor die 154. Bumps 164 are formed over conductive layer 162. Semiconductor die 154 is mounted to substrate 170 with bumps 164 metallurgically and electrically connected to conductive layer 172. Conductive layer 162*a*-162*e* of semiconductor die 154 are electrically common. Likewise, conductive layer 162*f*-162*j* are electrically common and conductive layer 162*k*-162*o* are electrically common. A DC test voltage $V_{TEST}$ is applied to test point 178*a* to cause a DC test current $I_{TEST}$ to flow through conductive layer 172*a*-172*o*. Conductive layer 172*m*-172*o* are electrically common. The DC test current $I_{TEST}$ flows through conductive layer 172*m*-172*o*, bumps 164*m*-164*o*, and conductive layer 162*m*-162*o*. The DC test current $I_{TEST}$ also flows through conductive layer 162*l*, bump 164*l*, and conductive layer 172*l*. Since conductive layer 172*m*-172*o* and conductive layer 162*m*-162*o* are electrically common, the DC test current $I_{TEST}$ is evenly divided between conductive layer 172*m*-172*o*, bumps 164*m*-164*o*, and conductive layer 162*m*-162*o*. Conductive layer 162*l*, bump 164*l*, and conductive layer 172*l* is an interconnect under test and receive the full DC test current $I_{TEST}$. The value of resistive element 174*c* is selected large so that conductive layer 162*l*, bump 164*l*, and conductive layer 172*l* conduct sufficient DC test current $I_{TEST}$ to complete electro-migration to failure.

Conductive layer 172*h*-172*j* are electrically common. The DC test current $I_{TEST}$ continues through conductive layer 172*h*-172*j*, bumps 164*h*-164*j*, and conductive layer 162*h*-162*j*. The DC test current $I_{TEST}$ also flows through conductive layer 162*g*, bump 164*g*, and conductive layer 172*g*. Since conductive layer 172*h*-172*j* and conductive layer 162*h*-162*j* are electrically common, the DC test current $I_{TEST}$ is evenly divided between conductive layer 172*h*-172*j*, bumps 164*h*-164*j*, and conductive layer 162*h*-162*j*. Conductive layer 162*g*, bump 164*g*, and conductive layer 172*g* is an interconnect under test and receive the full DC test current $I_{TEST}$. The value of resistive element 174*b* is selected large so that conductive layer 162*g*, bump 164*g*, and conductive layer 172*g* conduct sufficient DC test current $I_{TEST}$ to complete electro-migration to failure.

Conductive layer 172*c*-172*e* are electrically common. The DC test current $I_{TEST}$ continues through conductive layer 172c-172e, bumps 164c-164e, and conductive layer 162c-162e. The DC test current $I_{TEST}$ also flows through conductive layer 162b, bump 164b, and conductive layer 172b. Since conductive layer 172c-172e and conductive layer 162c-162e are electrically common, the DC test current $I_{TEST}$ is evenly divided between conductive layer 172c-172e, bumps 164c-164e, and conductive layer 162c-162e. Conductive layer 162b, bump 164b, and conductive layer 172b is an interconnect under test and receive the full DC test current $I_{TEST}$. The value of resistive element 174a is selected large so that conductive layer 162b, bump 164b, and conductive layer 172b conduct sufficient DC test current $I_{TEST}$ to complete electro-migration to failure. In one embodiment, the resistance of conductive layer 162b, bump 164b, and conductive layer 172b is about 1-10 milliohms and the resistance of resistive elements 174a-174c has a value of 100 milliohms.

Assume conductive layer 162l, bump 164l, or conductive layer 172l fails due to electro-migration. Conductive layer 162l, bump 164l, or conductive layer 172l will fail before conductive layer 172m-172o, bumps 164m-164o, or conductive layer 162m-162o because the DC test current $I_{TEST}$ is evenly divided between conductive layer 172m-172o, bumps 164m-164o, and conductive layer 162m-162o, while conductive layer 162l, bump 164l, and conductive layer 172l receive the full DC test current $I_{TEST}$. Upon failure of conductive layer 162l, bump 164l, or conductive layer 172l due to electro-migration, the full DC test current $I_{TEST}$ is automatically routed through resistive element 174c to continue the electro-migration testing of conductive layer 162g, bump 164g, and conductive layer 172g, as well as conductive layer 162b, bump 164b, and conductive layer 172b.

The failure of conductive layer 162l, bump 164l, or conductive layer 172l can be detected by sensing the voltage across conductive layer 162l, bump 164l, and conductive layer 172l at test points 178b-178c. An increase in voltage at test points 178b-178c indicates an open circuit failure of conductive layer 162l, bump 164l, or conductive layer 172l. The electro-migration testing continues for conductive layer 162g, bump 164g, and conductive layer 172g, as well as conductive layer 162b, bump 164b, and conductive layer 172b, by nature of resistive element 174c conducting the DC test current $I_{TEST}$ to the remaining interconnects under test. Resistive element 174c maintains electrical continuity between conductive layer 172m and 172j after an open circuit failure of conductive layer 162l, bump 164l, or conductive layer 172l.

Next assume conductive layer 162g, bump 164g, or conductive layer 172g fails due to electro-migration. Conductive layer 162g, bump 164g, or conductive layer 172g will fail before conductive layer 172h-172j, bumps 164h-164j, or conductive layer 162h-162j because the DC test current $I_{TEST}$ is evenly divided between conductive layer 172h-172j, bumps 164h-164j, and conductive layer 162h-162j, while conductive layer 162g, bump 164g, and conductive layer 172g receive the full DC test current $I_{TEST}$. Upon failure of conductive layer 162g, bump 164g, or conductive layer 172g due to electro-migration, the full DC test current $I_{TEST}$ is automatically routed through resistive element 174b to continue the electro-migration testing of conductive layer 162b, bump 164b, and conductive layer 172b.

The failure of conductive layer 162g, bump 164g, or conductive layer 172g can be detected by sensing the voltage across conductive layer 162g, bump 164g, or conductive layer 172g at test points 178d-178e. An increase in voltage at test points 178d-178e indicates an open circuit failure of conductive layer 162g, bump 164g, or conductive layer 172g. The electro-migration testing continues for conductive layer 162b, bump 164b, and conductive layer 172b, by nature of resistive element 174b conducting the DC test current $I_{TEST}$ to the remaining interconnects under test. Resistive element 174b maintains electrical continuity between conductive layer 172h and 172e after an open circuit failure of conductive layer 162b, bump 164b, or conductive layer 172g.

Substrate 170 with resistive elements 174a-174c allows multiple interconnects to be tested simultaneously using a single power supply to generate the DC test current $I_{TEST}$. The net resistance of semiconductor die 154 is monitored, rather than the resistance of each interconnect, to simplify the electro-migration test. CTTF can be determined by the sum of the individual TTF. When approximately half of the interconnects under test have failed due to electro-migration, a MTTF can be determined.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a conductive layer over the substrate;
   forming a resistive element electrically connected between first and second portions of the conductive layer;
   providing a semiconductor die including first and second bumps;
   mounting the semiconductor die to the substrate with the first and second bumps electrically connected to the first and second portions of the conductive layer, respectively; and
   routing a test current in sequence through the first portion of the conductive layer, through the first and second bumps, and through the second portion of the conductive layer until continuity failure of the second bump, wherein the test current continues to flow through the resistive element after the continuity failure of the second bump.

2. The method of claim 1, further including:
   forming third and fourth bumps over the semiconductor die; and
   mounting the semiconductor die to the substrate with the third and fourth bumps electrically connected to the third and fourth portions of the conductive layer, respectively, wherein the first, third, and fourth portions of the conductive layer are electrically common.

3. The method of claim 2, further including routing the test current in sequence through the first, third, and fourth portions of the conductive layer, through the first, third, and fourth bumps, through the second bump, and through the second portion of the conductive layer until continuity failure of the second bump.

4. The method of claim 1, further including mounting a plurality of semiconductor die to the substrate.

5. The method of claim 1, further including sensing a voltage across the second bump.

6. The method of claim 1, wherein the test current originates from a single power supply.

7. A method of making a semiconductor device, comprising:
   providing a substrate;
   forming a conductive layer over the substrate;
   forming a resistive element between first and second portions of the conductive layer;

providing a semiconductor die with a plurality of interconnect structures;

mounting the semiconductor die to the substrate with the interconnect structures electrically connected to the first and second portions of the conductive layer; and routing a test current in sequence through the interconnect structures until continuity failure of one of the interconnect structures, wherein the test current continues to flow through the resistive element after the continuity failure.

8. The method of claim 7, wherein the interconnect structures include a plurality of bumps.

9. The method of claim 7, further including routing the test current through a plurality of electrically common interconnect structures.

10. The method of claim 9, further including routing the test current in sequence through the electrically common interconnect structures, through at least one of the interconnect structures, and through the second portion of the conductive layer until continuity failure.

11. The method of claim 7, further including mounting a plurality of semiconductor die to the substrate.

12. The method of claim 10, further including sensing a voltage across at least one of the interconnect structures.

13. The method of claim 7, wherein the test current originates from a single power supply.

14. A method of making a semiconductor device, comprising:

providing an electro-migration test substrate;

forming a conductive layer over the electro-migration test substrate;

forming a resistive element on the electro-migration substrate to electrically connected between first and second portions of the conductive layer on the electro-migration test substrate;

providing a semiconductor die with a plurality of interconnect structures;

mounting the semiconductor die to the electro-migration test substrate with the interconnect structures electrically connected to the first and second portions of the conductive layer; and routing a test current in sequence through the interconnect structures until continuity failure of one of the interconnect structures, wherein the test current continues to flow through the resistive element after the continuity failure.

15. The method of claim 14, wherein the interconnect structures include a plurality of bumps.

16. The method of claim 14, further including routing the test current through a plurality of electrically common interconnect structures.

17. The method of claim 16, further including routing the test current in sequence through the electrically common interconnect structures, through at least one of the interconnect structures, and through the second portion of the conductive layer until continuity failure.

18. The method of claim 14, further including mounting a plurality of semiconductor die to the substrate.

19. The method of claim 17, further including sensing a voltage across at least one of the interconnect structures.

20. A semiconductor device, comprising:

an electro-migration test substrate;

a conductive layer formed over the electro-migration test substrate; and a resistive element formed between portions of the conductive layer on the electro-migration test substrate; and a semiconductor die with a plurality of interconnect structures, the semiconductor die being mounted to the electro-migration test substrate with the interconnect structures electrically connected to first and second portions of the conductive layer.

21. The semiconductor device of claim 20, wherein the interconnect structures include a plurality of bumps.

22. The semiconductor device of claim 20, wherein a test current is routed in sequence through the interconnect structures until continuity failure of one of the interconnect structures.

23. The semiconductor device of claim 22, wherein the test current is routed in sequence through the electrically common interconnect structures, through at least one of the interconnect structures, and through the second portion of the conductive layer until continuity failure.

* * * * *